United States Patent [19]

Taguchi

[11] 4,017,135

[45] Apr. 12, 1977

[54] ELECTRICAL CONTACT ELEMENT

[75] Inventor: Hiroshi Taguchi, Tokyo, Japan

[73] Assignee: AMP Incorporated, Harrisburg, Pa.

[22] Filed: Sept. 5, 1975

[21] Appl. No.: 610,792

[30] Foreign Application Priority Data

Sept. 19, 1974 Japan ............................ 49-107095

[52] U.S. Cl. .................... 339/17 LM; 339/176 MP; 339/221 R; 339/276 SF

[51] Int. Cl.[2] ............................................ H05K 1/08

[58] Field of Search ........... 339/17 C, 17 L, 17 LC, 339/17 LM, 17 M, 176 MP, 220 R, 221 R, 221 M, 276 SF

[56] References Cited

UNITED STATES PATENTS

| | | | |
|---|---|---|---|
| 3,525,972 | 8/1970 | Asick | 339/17 L |
| 3,573,711 | 4/1971 | Henschen | 339/176 MP |
| 3,902,776 | 9/1975 | Williams | 339/17 LM |
| 3,910,671 | 10/1975 | Townsend | 339/221 M |

*Primary Examiner*—Gerald A. Dost
*Assistant Examiner*—Mark S. Bicks
*Attorney, Agent, or Firm*—Allan B. Osborne; William J. Keating

[57] ABSTRACT

An electrical contact element for use in connecting two printed circuit boards is of substantially U-shape with legs having inwardly directed contact arms for contacting one printed circuit board, and a transverse portion for reception in a hole in a second printed circuit board, a plurality of such contact elements being used together in free-standing manner to provide a complete printed circuit board edge connector.

15 Claims, 6 Drawing Figures

ELECTRICAL CONTACT ELEMENT

This invention relates to an electrical contact element for use in connecting a first printed circuit board, commonly known as a daughter board, to a second printed circuit board, commonly known as a mother board.

In the printed circuit board art, it is often desired to make electrical connections between conductors on two or more printed circuit boards.

It is sometimes also desirable to make mechanical connection between the boards simultaneously with the making of the electrical connections, this being so when a daughter board is mounted upon a mother board.

One method by which such dual-purpose connection has been achieved is by means of a connector comprising a housing of electrically insulating material carrying a row of electrical contact elements. The housing is mounted on a mother board, and the daughter board is then inserted into a slot in the housing, the electrical contact elements being such as to interconnect the desired conductors on the boards, and at the same time grip the daughter board to support it in the desired position.

There are many applications, however, in which such connectors utilizing a housing or the like are not necessary or desirable, particularly since such a housing constitutes a significant part of the cost of a connector, and also requires an outlay in time and labour, and sometimes tooling, for assembly.

One arrangement used in such applications, therefore, comprises a plurality of individual so-called "free-standing" contact elements, which are mounted in a row on the mother board and provide a common slot into which a daughter board can be inserted.

However, known free-standing contact elements generally require manual insertion into pre-formed holes in the mother board, followed by wave or hand-soldering operations to secure the contact elements in the holes.

According to this invention there is provided an electrical contact element comprising a substantially U-shaped member having first and second legs joined by a transverse portion in which the element is stamped and formed from sheet metal with the first leg having a major surface which faces and which is substantially parallel to a major surface of the second leg, each leg having a contact arm struck therefrom to extend towards the other leg, the contact arm being integral with the leg adjacent the free end thereof, and lateral edge portions of the legs being bent to extend substantially perpendicularly to the major surfaces of the legs and terminating in shoulders facing but spaced from the transverse portion of the element.

The contact element of this invention has the advantages that it can easily and cheaply be manufactured by stamping and forming sheet metal, and can readily be mounted in a hole in a printed circuit board using known machinery and techniques. After mounting, a plurality of the contact elements of this invention can provide good electrical and mechanical connection between the two printed circuit boards.

This invention will now be described by way of example with reference to the drawings in which.

Figure 1:
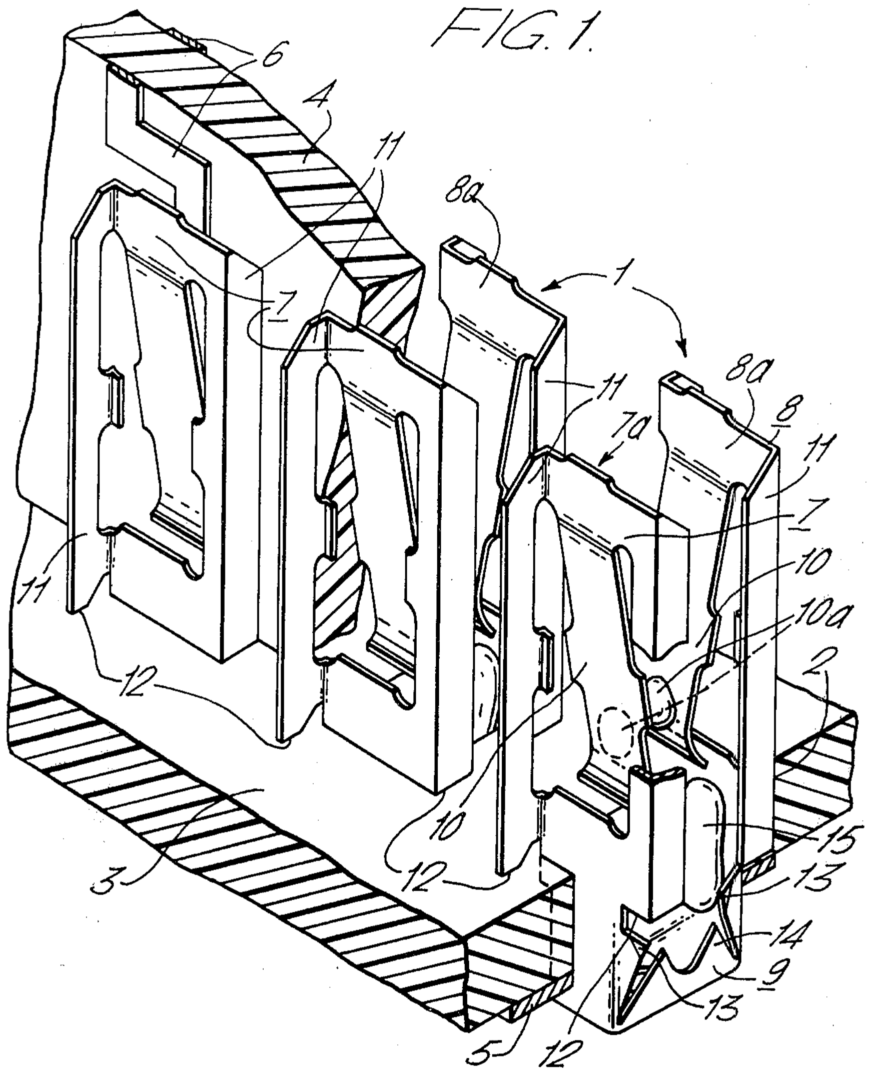
FIG. 1 is a perspective view of a plurality of contact elements according to the invention mounted on a mother printed circuit board to form an edge connector for a daughter printed circuit board.
Figure 2:
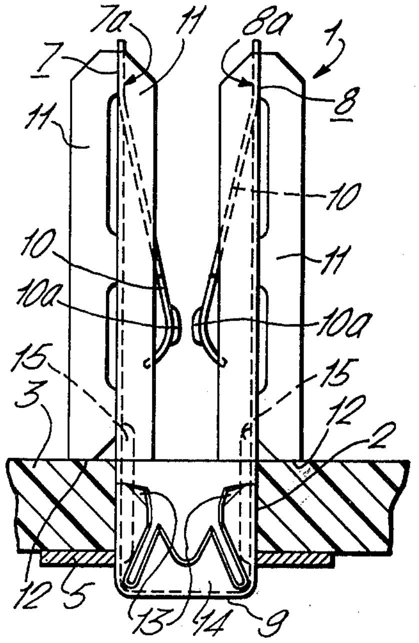
FIG. 2 is a front elevation of one of the contact elements of FIG. 1.
Figure 3:
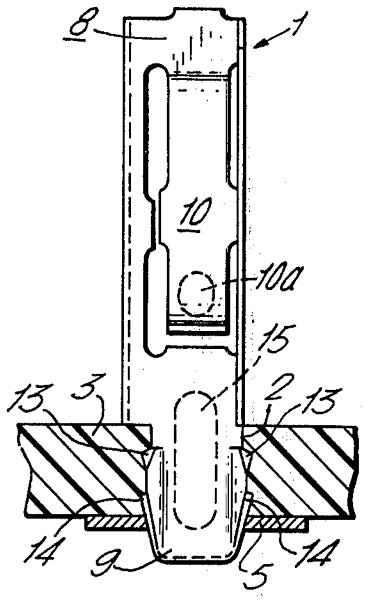
FIG. 3 is a side elevation of the contact element of FIG. 2.

Referring to FIGS. 1, 2 and 3, a plurality of contact elements 1 are mounted in a row in individual holes 2 in a mother printed circuit board 3 to form an edge connector for a daughter printed circuit board 4 whereby conductors 5 on the board 3 can be electrically connected to conductors 6 on the board 4.

Each contact element 1 is a substantially U-shaped member having first and second legs 7 and 8 joined by a transverse portion 9.

The contact element 1 has been stamped and formed from sheet metal, for example an alloy of copper, brass and other metals, possibly with a plating of gold or silver, with the first leg 7 having a major surface 7*a* which faces and which is substantially parallel to a major surface 8*a* of the second leg 8.

Each leg 7 or 8 has a contact arm 10 struck therefrom to extend towards the other leg 8 or 7, the arm 10 being integral with the leg 7 or 8 adjacent the free end thereof, and having a dimple 10*a* directed towards the dimple 10*a* of the other contact arm 10.

Lateral edge portions 11 of the legs 7 and 8 are bent to extend substantially perpendicularly to the major surfaces 7*a* and 8*a* of the legs 7 and 8, the portions 11 terminating in shoulders 12 facing but spaced from the transverse portion 9 of the contact element 1. As shown the lateral edge portions 11 of each leg 7 or 8 extend in opposite directions, and each in the opposite direction to that of the other leg 8 or 7 at the same side of the contact element 1.

Each leg 7 or 8 is formed on each edge between the shoulder 12 of the bent edge portion 11 and the transverse portion 9 of the contact element 1, with an outwardly directed tang 13, and the transverse portion 9 is formed with lateral edge portions 14 extending outwardly and in the same direction as the legs 7 and 8.

For use, a contact element 1 as described above is inserted into a hole 2 in a printed circuit 3, in a manner which will be described later, until, as shown in FIGS. 1 to 3, the transverse portion 9 has passed through the hole 2 and the shoulders 12 on the edge portions 11 engage the surface of the board 3. The tangs 13 on the legs 7 and 8, and the edge portions 14 of the transverse portion 9 then bite into the wall of the hole 2 whereby the contact element 1 becomes secured in the hole 2, with the transverse portion 9 thereof electrically connected to a conductor 5 on the board 3.

As shown each leg 7 or 8 is formed with an elongate embossment 15 adjacent the junction between the leg 7 or 8 and the transverse portion 9 of the contact element, which embossment 15 serves to prevent bending of the leg 7 or 8 as the contact element 1 is inserted into the hole 2, and subsequently thereto.

With a plurality of contact elements 1 arranged in a row in individual holes 2 in the board 3 as shown in FIG. 1, the edge of a daughter printed circuit board 4 can be inserted between the legs 7 and 8 of the contact elements 1, and thus between the contact arms 10 thereof, such that the dimples 10*a* on the contact arms 10 make electrical connection to the conductors 6 on the board 4. Thus, the conductors 5 on the board 3 are connected to the conductors 6 on the board 4 as required.

Figure 4:
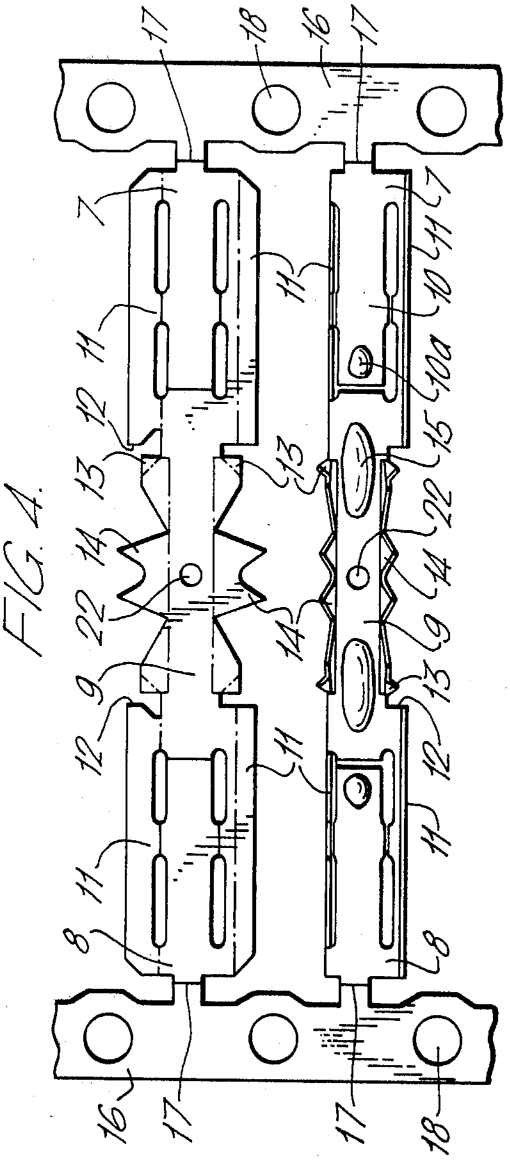
FIG. 4 is a plan view of two contact elements as shown in FIG 1, at different stages of manufacture.
Figure 5:
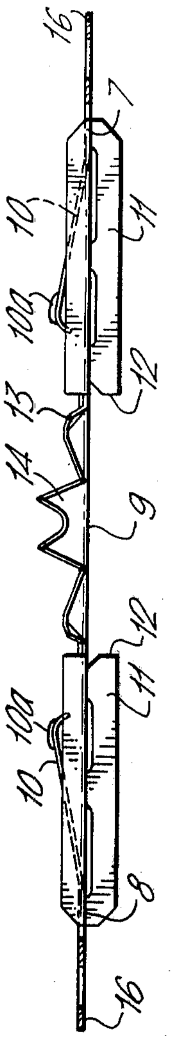
FIG. 5 is a side view of FIG. 4.

Referring now to FIGS. 4 and 5, as previously mentioned the contact elements 1 are stamped and formed from sheet metal, and FIGS. 4 and 5 show two contact elements 1 in different stages of manufacture.

The contact element blanks are initially formed between a pair of carrier strips 16 connected to the free ends of the legs 7 and 8 by way of frangible portions 17. The carrier strips 16 have holes 18 therein whereby the strips 16 and the blanks carried thereby can be fed through manufacturing and insertion machinery in known manner.

The blank shown on the left in FIG. 4 is in an intitial planar, merely stamped form, whereas the blank shown on the right in FIG. 4, and in FIG. 5, has been further formed into an intermediate condition in which the legs 7 and 8 and the transverse portion 9 are still co-planar but in which the contact arms 10 with their dimples 10*a*, the embossments 15, the tangs 13, and the edge portions 11 and 14 have been bent as required.

Figure 6:
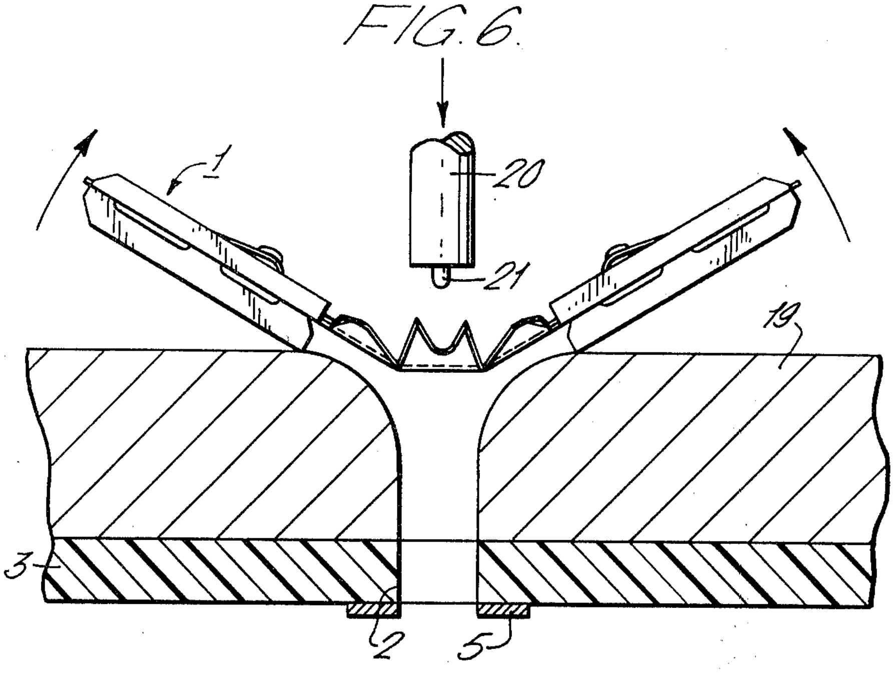
FIG. 6 illustrates the insertion of one of the contact elements of FIGS. 4 and 5 into a hole in a printed circuit board.

Referring now to FIG. 6, also for insertion of a contact element 1 into a hole 2 in a printed circuit board 3, the intermediate blank is fed by means of the carrier strips 16 until the transverse portion 9 is positioned over the hole 2. Then, simultaneously, the carrier strips 16 are separated from the blank by breaking of the frangible portions 17, an apertured mandrel 19 is positioned between the blank and the board 3, and a punch 20 is urged to engage the blank and urge the blank through the aperture in the mandrel 19 and into the hole 2 in the board 3. The punch 20 has a reduced diameter leading end portion 21 which engages in a hole 22 (FIG. 4) at the center of the transverse portion 9 of the contact element 1 to locate the blank accurately with respect to the mandrel 19 and the board 3.

As shown in FIG. 6 the aperture in the mandrel 19 has a flared mouth, and as the punch 20 urges the blank into the aperture in the mandrel the blank is transformed from its condition shown in FIGS. 4 and 5 to its final U-shape shown in FIGS. 1 to 3 by engagement of the legs 7 and 8 with the walls of the aperture in the mandrel 19. During this operation the embossments 15 in the legs 7 and 8 serve to ensure that the blank bends at the correct positions, that is at the required junctions between the legs 7 and 8 and the transverse portion 9.

After the contact element 1 has been fully inserted into the hole 2 as shown in FIGS. 1 to 3, the punch 20 is withdrawn and the mandrel 19 removed.

Although not shown in the drawings, the holes 2 in the board 3 can be through-plated in known manner in order to enhance the electrical connection between the contact elements 1 and the conductors 5 on the board 3.

What is claimed is:

1. A single element contact of electrically conducting material for mounting and making an electrical connection between a mother and a daughter circuit board comprising:

a base having a generally rectangularly shaped cross-section locatable within a hole in the mother board to support the contact upon the mother board and make electrical connection therewith;

a pair of parallel upstanding members having a generally Z-shaped cross-sectional configuration carried upon said base to extend upwardly from the mother board for receiving the daughter board therebetween; and the ends of said Z-shaped upstanding members being terminated to form shoulders which rest upon the surface of said mother board when said contact is inserted therein;

a pair of tangs, each formed of a portion of a respective one of said members bent in the direction of the other of said members, whereby each of said tangs engages the daughter board when it is inserted between said members to support it and to make electrical connection to it.

2. The contact of claim 1 wherein said base extends through the mother board when it is located within a hole thereof.

3. The contact of claim 2 wherein said base comprises at least a pair of tabs extending outwardly from a center portion of said contact to engage the wall of said hole.

4. The contact of claim 2 wherein each of said upstanding members has opposite edges bent in opposite right angle directions to form said Z-cross-sectional shape of said member, to support said member upon the mother board and to lend rigidity to said upstanding member.

5. The contact of claim 2 wherein said pair of tangs each comprises an embossed protrusion to contact and enhance the electrical connection to the daughter board.

6. An article of manufacture for forming an electrical contact between mother and daughter substrates, and for supporting said daughter substrate upon said mother substrate, formed of a single flat piece of electrically conducting material, comprising:

a. a pair of parallel carrier strips;

b. a contact element detachably carried between said two carrier strips, said contact element including, 1. a pair of wing members, each attached at an end thereof to a respective one of said carrier strips, having a center portion cut upon three sides to enable said center portion to be bent away from said wing member, and having edges extending therefrom bendable at opposite at right angles to enable said wing members to have Z-cross-sectional shapes; and 2. a center member attached to said wing members at ends opposite the ends attached to said carrier strips, whereby said wing members can be bent to right angles with respect to said center member to enable said center member to be inserted into a hole in said mother substrate, and said wing members to extend upwardly therefrom to receive said daughter substrate therebetween.

7. The article of manufacture of claim 6 further comprising:

a pair of tab carrying members each attached between said center member and a respective one of said wing members to engage the wall of a hole in said mother substrate when said center portion is inserted thereinto.

8. The article of manufacture of claim 7 further comprising two pair of outwardly extending tab members upon said center portion to engage the wall of a hole of said mother substrate when said center portion is inserted thereinto.

9. The article of manufacture of claim 8 wherein a plurality of similar contact elements are carried side-by-side upon said carrier strips.

10. An assembly for supporting a daughter circuit board upon a mother circuit board and for establishing electrical connection therebetween, comprising, a plurality of electrical contact elements each formed from a single stamped flat piece of electrically conducting material, and including, a. a base portion insertable into a hole in said mother circuit board;

b. two pair of tangs attached to said base, upwardly bent to engage the wall of said hole;

c. two flat members attached to and bent upwardly from said base portion;

d. two pair of tabs, each attached to one of said flat members adjacent said base portion and bent outwardly to engage the wall of said hole;

e. two pair of two elongated members, each pair bent from opposite edges of one of said flat members to be adapted to engage said mother circuit board at one end thereof; and f. a pair of tangs each formed of a center portion of one of said flat members and bent inwardly to engage said daughter circuit board when it is inserted therebetween;

said plurality of electrical contacts being alignable on said mother circuit board whereby said daughter circuit board can be insertable to between the flat members of each.

11. A free-standing contact for mounting on a first board and which, when used with similar contacts arranged along a line, forms an elongated slot-like opening for receiving the edge of second board and for making a series of electrical contacts therewith, comprising:

a U-shaped portion having a first leg portion, a second leg portion, and a transverse portion, with each of said first and second leg portions have major surfaces which face each other and which are substantially parallel with each other;

said first and second leg portions having a tab formed centrally therein and bent into said U, whereby said transverse portion is insertable into a hole in said first board;

opposite edges of each of said first and second leg portions being bent in opposite right angle directions to form said legs into structurally strong elements with at least a portion of their cross-sectional configuration being substantially Z-shaped;

each of said bent edges being adapted to contact a surface of said first board to support said free-standing contact thereupon.

12. The free-standing contact in accordance with claim 11 in which said transverse portion comprises two pair of tangs, each pair being bent generally upwardly to engage the wall of the hole into which said transverse portion is inserted.

13. In combination with the free-standing contact of claim 12, a plurality of similar free-standing contacts, all of which are formed from a single continuous strip of metal and which, during forming, are joined together by a carrier strip, in which said plurality of free-standing contacts are inserted into respective holes in said first board by an automatic insertion tool.

14. A free-standing contact in accordance with claim 11, further comprising an embossed protrusion on said tab to enhance the electrical contact to said second board.

15. A free-standing contact adapted for automatic machine insertion for mounting upon a first board, which when used with a plurality of similar free-standing contacts forms a slot for receiving a second board, and forming an electrical connection between said first and second boards, formed of a single stamped piece of material, comprising:

a U-shaped portion having first and second upstanding legs and an interconnecting transverse portion;

said transverse portion being adapted to be inserted into a hole in said first board;

said first and second legs having essentially flat parallel faces for receiving said second board therebetween;

said first and second legs each having a central portion thereof cut to form a tang bent toward the interior of the U to engage the second board when it is received between said faces;

said first and second legs each having their side edges bent to form a generally Z-cross-sectional shape;

said first and second legs each having a pair of outstanding triangular tabs bent generally at slightly less than a right angle from said face to engage the wall of said hole;

and said transverse portion having at least a pair of triangular tabs upwardly bent to engage the wall of said hole.

* * * * *